(12) United States Patent
Holsteyns et al.

(10) Patent No.: US 8,202,369 B2
(45) Date of Patent: Jun. 19, 2012

(54) METHOD AND APPARATUS FOR CONTROLLED TRANSIENT CAVITATION

(75) Inventors: Frank Holsteyns, Blanden (BE); Kuntack Lee, Leuven (BE)

(73) Assignees: IMEC, Leuven (BE); Samsung Electronics Co. Ltd., Kyongi-do (KR)

( * ) Notice: Subject to any disclaimer, the term of this patent is extended or adjusted under 35 U.S.C. 154(b) by 314 days.

(21) Appl. No.: 12/119,313

(22) Filed: May 12, 2008

(65) Prior Publication Data

US 2008/0276960 A1 Nov. 13, 2008

Related U.S. Application Data

(62) Division of application No. 11/233,437, filed on Sep. 21, 2005, now abandoned.

(60) Provisional application No. 60/612,087, filed on Sep. 21, 2004.

(30) Foreign Application Priority Data

Sep. 21, 2004 (EP) .................................. 04447204

(51) Int. Cl.
   *B08B 7/04* (2006.01)
   *B08B 7/00* (2006.01)
   *B08B 7/02* (2006.01)
(52) U.S. Cl. ................. 134/1.3; 134/1; 134/18; 134/30; 134/902
(58) Field of Classification Search ............... 134/1, 1.3, 134/18, 30, 184, 902
   See application file for complete search history.

(56) References Cited

U.S. PATENT DOCUMENTS

| 4,076,617 A | 2/1978 | Bybel et al. |
| 4,085,170 A | 4/1978 | Simpson et al. |
| 4,793,714 A | 12/1988 | Gruber |
| 5,314,644 A | 5/1994 | Michelsen et al. |
| 5,437,729 A | 8/1995 | Boatner et al. |
| 5,582,578 A | 12/1996 | Zhong et al. |
| 5,594,165 A | 1/1997 | Madanshetty |
| 5,681,396 A | 10/1997 | Madanshetty |

(Continued)

FOREIGN PATENT DOCUMENTS

DE 43 05 660 9/1993

(Continued)

OTHER PUBLICATIONS

European Search Report No. EP 04 44 7204 for Interuniversitair Micro-Elektronica Centrum, dated Feb. 11, 2005.

*Primary Examiner* — Alexander Markoff
(74) *Attorney, Agent, or Firm* — McDonnell Boehnen Hulbert & Berghoff LLP

(57) ABSTRACT

Methods and apparatus for creating and controlling transient cavitation are disclosed. An example method includes selecting a range of bubble sizes to be created in a liquid and selecting characteristics for an acoustic field to be applied to the liquid. The method further includes creating gas bubbles of the selected range of bubble sizes in the liquid, creating an acoustic field with the selected characteristics and subjecting the liquid to the acoustic field. In the example method, at least one of the range of bubble sizes and the characteristics of the acoustic field is selected in correspondence with the other so as to control transient cavitation in the liquid for the selected range of bubble sizes. Particularly, the methods and apparatus may be used for the cleaning of a surface, such as a semiconductor substrate.

13 Claims, 11 Drawing Sheets

U.S. PATENT DOCUMENTS

| | | |
|---|---|---|
| 5,931,173 A | 8/1999 | Schiele |
| 5,961,895 A | 10/1999 | Sanford |
| 6,039,309 A | 3/2000 | Kuklinski |
| 6,048,405 A | 4/2000 | Skrovan et al. |
| 7,683,525 B2 * | 3/2010 | Beck et al. .................. 310/328 |
| 2002/0134402 A1 | 9/2002 | Madanshetty |
| 2003/0220567 A1 | 11/2003 | DeCastro et al. |
| 2004/0039329 A1 | 2/2004 | Ueberle |
| 2004/0134514 A1 | 7/2004 | Wu et al. |
| 2004/0251566 A1 | 12/2004 | Kozyuk |
| 2005/0017599 A1 * | 1/2005 | Puskas .......................... 310/317 |
| 2006/0060991 A1 | 3/2006 | Holsteyns et al. |

FOREIGN PATENT DOCUMENTS

| | | |
|---|---|---|
| EP | 0 860 866 | 8/1998 |

* cited by examiner

METHOD AND APPARATUS FOR CONTROLLED TRANSIENT CAVITATION

CROSS REFERENCE TO RELATED APPLICATIONS

This application is a divisional of U.S. patent application Ser. No. 11/233,437, filed Sep. 21, 2005 now abandoned, which is a continuation of U.S. Provisional Patent Application No. 60/612,087, filed Sep. 21, 2004. Accordingly, this application claims priority to U.S. patent application Ser. No. 11/233,437 under 35 U.S.C. § 120, which claims priority to U.S. Provisional Patent Application No. 60/612,087 under 35 U.S.C. § 119(e). U.S. patent application Ser. No. 11/233,437 also claims priority to European Patent Application No. 04447204.1, filed Sep. 21, 2004, under 35 U.S.C. § 119(a). U.S. patent application Ser. No. 11/233,437, U.S. Provisional Patent Application No. 60/612,087, and European Patent Application No. 04447204.1 are incorporated herein by reference in their entirety.

BACKGROUND

I. Field

This disclosure relates to methods and apparatus for creating and controlling transient cavitation in a liquid.

II. Description of Related Art

Cavitation is generally known and defined as the activity of bubbles (e.g., gas bubbles) in a liquid. Such activity includes growth, pulsation and/or collapse of bubbles in a liquid. The pulsation of bubbles is known as stable cavitation, whereas the collapse of bubbles is known as transient cavitation. The occurrence of transient cavitation can release high amounts of energy towards an area surrounding the cavitation. Such energy may be, for example, in the form of heat, shockwaves, etc.

Transient cavitation is applied in a large number of technical fields. For example, in sonochemistry, bubbles collapsing in an ultrasonic field have a catalytic effect on chemical reactions. Also, cavitation is used in medical applications, for example, as a contrast enhancer in ultrasound diagnostics. However, one of the best-known applications of cavitation may be the removal of particles from a surface of a substrate, such as a semiconductor substrate.

A common problem in these various applications is control of transient cavitation such that it occurs in a desired fashion with respect to location and mechanics of bubble collapses. For example, in substrate cleaning technology, a common problem is non-uniform removal of particles from substrate surfaces. In such applications, it is desirable that the particles being removed are removed from the substrate surface without damaging the substrate as a result of "heavy collapse" and that a uniformly cleaned surface results. This outcome is difficult to accomplish using current approaches.

Particle removal mechanisms have been previously studied for approaches that include (i) gasifying a cleaning liquid with gasses such as oxygen, nitrogen, argon, xenon, carbon dioxide, etc., or (ii) degassing a cleaning liquid. These liquids are then used to clean a wafer and sonoluminescence (SL) signals are generated by collapsing bubbles. Furthermore, after the cleaning process, particle removal efficiency is determined.

FIG. 1 is graph which demonstrates that the presence of gas in a liquid (a gasified liquid) results in achieving higher particle removal efficiency (PRE) percentages. FIG. 2 is a graph that illustrates SL signals that are plotted for gasified and degassed liquids. In gasified liquids, SL signals, generated by collapsing bubbles, can be detected as compared to a degassed liquid in which little to no SL signal is detected. The combination of FIGS. 1 and 2 illustrates that transient cavitation is one basis for particle removal in such approaches.

FIG. 3 is a graph presented by Neppiras in Acoustic Cavitation, 1980, which illustrates, that dependent on a driving pressure, a frequency of an acoustic field and gas bubble radius, gas bubbles can grow (zone Y) and then collapse when entering area Z, or may dissolve without collapse, if the bubbles are small enough to enter zone X.

In U.S. Pat. No. 6,048,405 to Skrovan (hereafter "Skrovan"), a cleaning method for use in the microelectronics industry is disclosed. In the method described in Slcrovan, gas bubbles are introduced below the surface of a substrate assembly such that the bubbles pass across the surface as they rise in the liquid. In the method described in Skrovan, the substrate assembly is immersed in a region or a liquid through which megasonic energy is projected. In Skrovan, particles are released from the surface by shoclwaves from the megasonic field.

As was demonstrated by FIGS. 1 and 2, the use of megasonic energy alone is not an efficient approach for particle removal as compared to gasified liquid in combination with megasonic energy. Therefore, application of the method disclosed in Skrovan results in a non-uniform cleaning being obtained. Further, simply gasifying the liquid used in the method of Skrovan could result in substrate damage, e.g., due to heavy collapse. Thus, alternative approaches for cleaning processes using gasified liquids are desirable.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods, which are given by way of example and meant to be illustrative, not limiting in scope. In various embodiments, one or more of the above-described problems have been reduced or eliminated, while other embodiments are directed to other improvements.

Example methods for creating and controlling transient cavitation are disclosed. One such method includes creating gas bubbles having a range of bubble sizes in a liquid, creating an acoustic field and subjecting the liquid to the acoustic field. In such methods, the range of bubble sizes and/or the characteristics of the acoustic field are selected so as to control transient cavitation in the liquid for the range of bubble sizes.

The liquid may be selected from, or may be a combination of one or more of the following: (i) an aqueous solution, (ii) an organic solvent, (iii) an inorganic solvent, (iv) a polar or non-polar solvent, (v) a mixture of chemicals, or (vi) any fluid in which a gas can be dissolved or injected, such as deionized water. Such methods may be used in any number of cleaning applications, e.g. for medical equipment or for wafers in the semiconductor industry.

The characteristics of the applied acoustic field that are utilized for adjusting the character of the acoustic field may include frequency, intensity, position of a transducer or transducers, or any other parameter affecting the acoustic makeup of the field. For instance, the acoustic field may be generated using a single frequency, or may be generated using multiple frequencies.

In certain embodiments of such methods, the range of bubble sizes may be selected subsequent to and in correspondence with selected characteristics of the acoustic field. If the characteristics of the acoustic field are fixed or if the selection of those characteristics is limited, the range of bubble sizes may be adjusted in correspondence with the generated (available) acoustic field.

In other embodiments, the characteristics of the acoustic field may be selected subsequent to and in correspondence with a selected range of bubble sizes. As part of such a method, the range of bubble sizes may be determined using any number of possible approaches. If the range of bubble sizes is fixed, or if the selection of a range of bubble sizes is limited, the characteristics of the acoustic field may be adjusted in correspondence with the range of bubble sizes.

Creating gas bubbles having a selected range of bubble sizes may accomplished in any number of fashions. For example, creating the gas bubbles may include (i) dissolving gas in a liquid by means of a gasification unit or any other means to dissolve gas in the liquid; (ii) injecting gas in a liquid by means of a bubbler system, a capillary, a nozzle, a membrane contactor or any device for injecting gas bubbles into the liquid; (iii) applying a pressure drop, preferably a rapid pressure drop or applying one or multiple compression/decompression cycles; (iv) raising the temperature of a liquid, or one or more cycles of heating/cooling the liquid; (v) subjecting a liquid to an additional acoustic field; (vi) dissolving or injecting two or more different gasses into the liquid; and/or (vii) adding a surfactant to the liquid. Using the foregoing (or other) techniques, the range of bubble sizes may be varied.

An example apparatus for generating and controlling transient cavitation includes a device for creating gas bubbles having a range of bubble sizes in a liquid. The apparatus further includes an acoustic field generator for generating an acoustic field having one or more component frequencies. The acoustic field generator is acoustically coupled with the liquid. In the apparatus, at least one of (i) the device for creating gas bubbles having a range of sizes in the liquid and (ii) the acoustic field generator is adjustable so as to tune the range of bubble sizes or the acoustic field so as to control transient cavitation in the liquid for a selected range of bubble sizes.

Depending on the particular embodiment, the device for creating gas bubbles having a range of bubble sizes may include (i) a gasification unit or other device for dissolving one or more gasses in a liquid; (ii) a valve, a nozzle, a membrane contactor or other device for injecting gas bubbles (of one or more gasses) in a liquid; (iii) a heat exchanging system or any means for heating/cooling a liquid; (iv) a pressure regulating device for generating a pressure drop or generating one or multiple compression/decompression cycles; (v) a second acoustic field generator for subjecting a liquid to an additional acoustic field; and/or (vi) a device for adding a surfactant to the liquid.

Depending on the particular embodiment, apparatus for generating and controlling transient cavitation may further include a measurement unit for measuring the range of bubble sizes; and/or a control unit for controlling the device used to create gas bubbles and/or controlling the acoustic field generator.

BRIEF DESCRIPTION OF THE DRAWINGS

Example embodiments are illustrated in referenced figures of the drawings. It is intended that the embodiments and figures disclosed herein are to be considered illustrative rather than restrictive.

DETAILED DESCRIPTION

Figure 1:
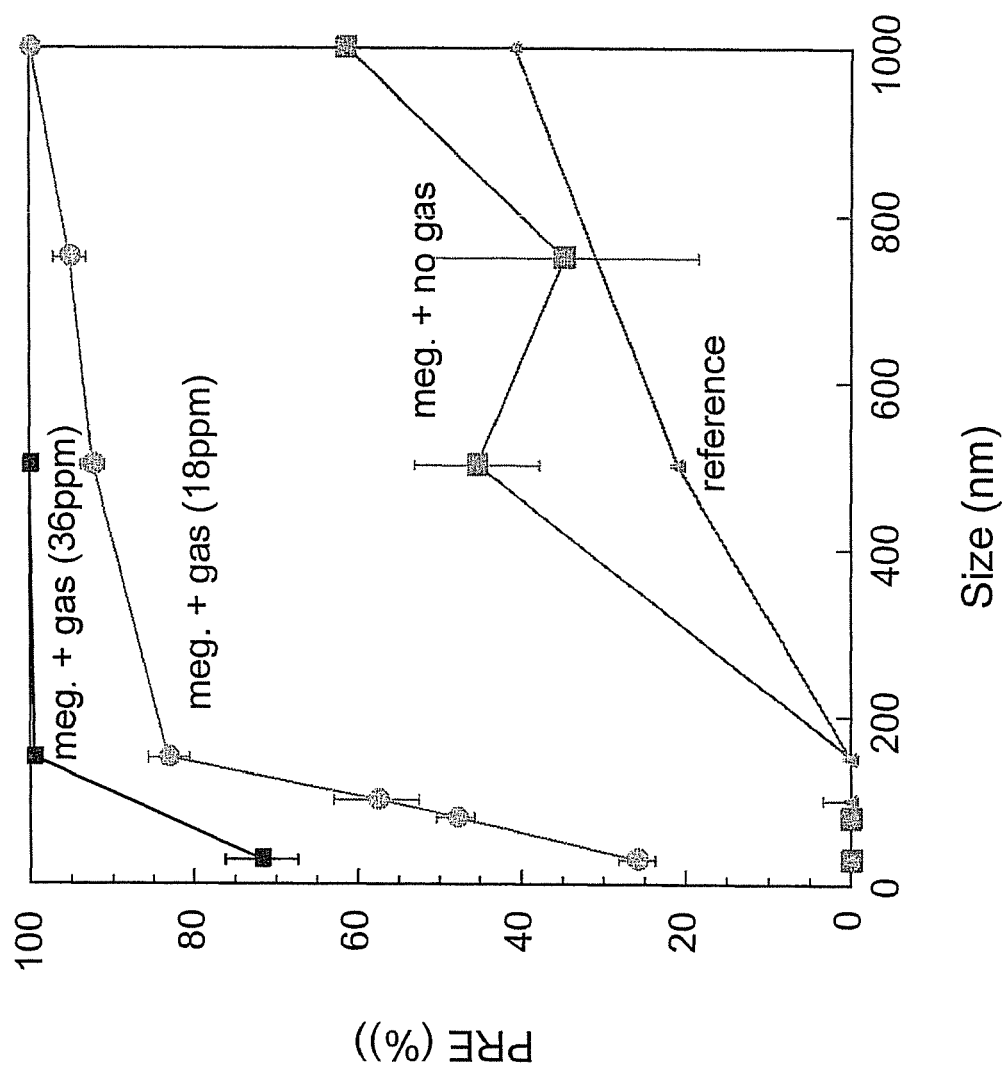
FIG. 1 is a graph illustrating particle removal efficiency (PRE) as a function of particle size and gas concentration in a liquid.
Figure 2:
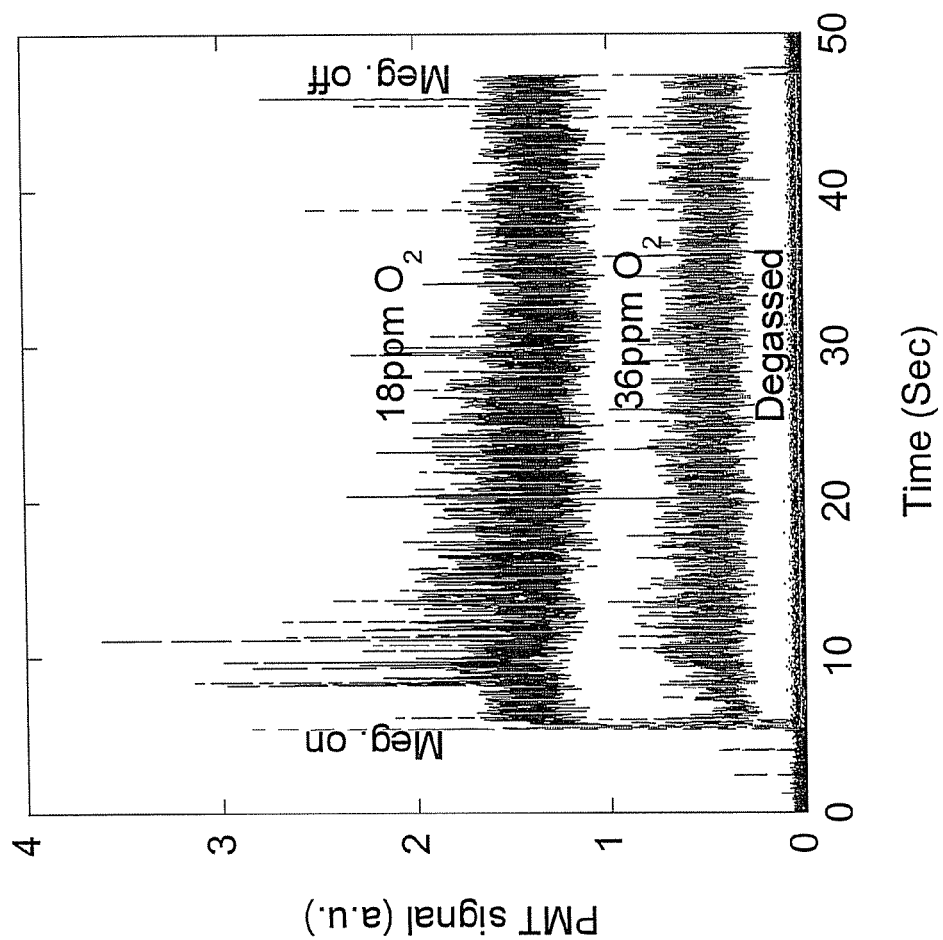
FIG. 2 is a graph that illustrates sonoluminescence (SL) signals as a function of time and gas concentration in a liquid.
Figure 3:
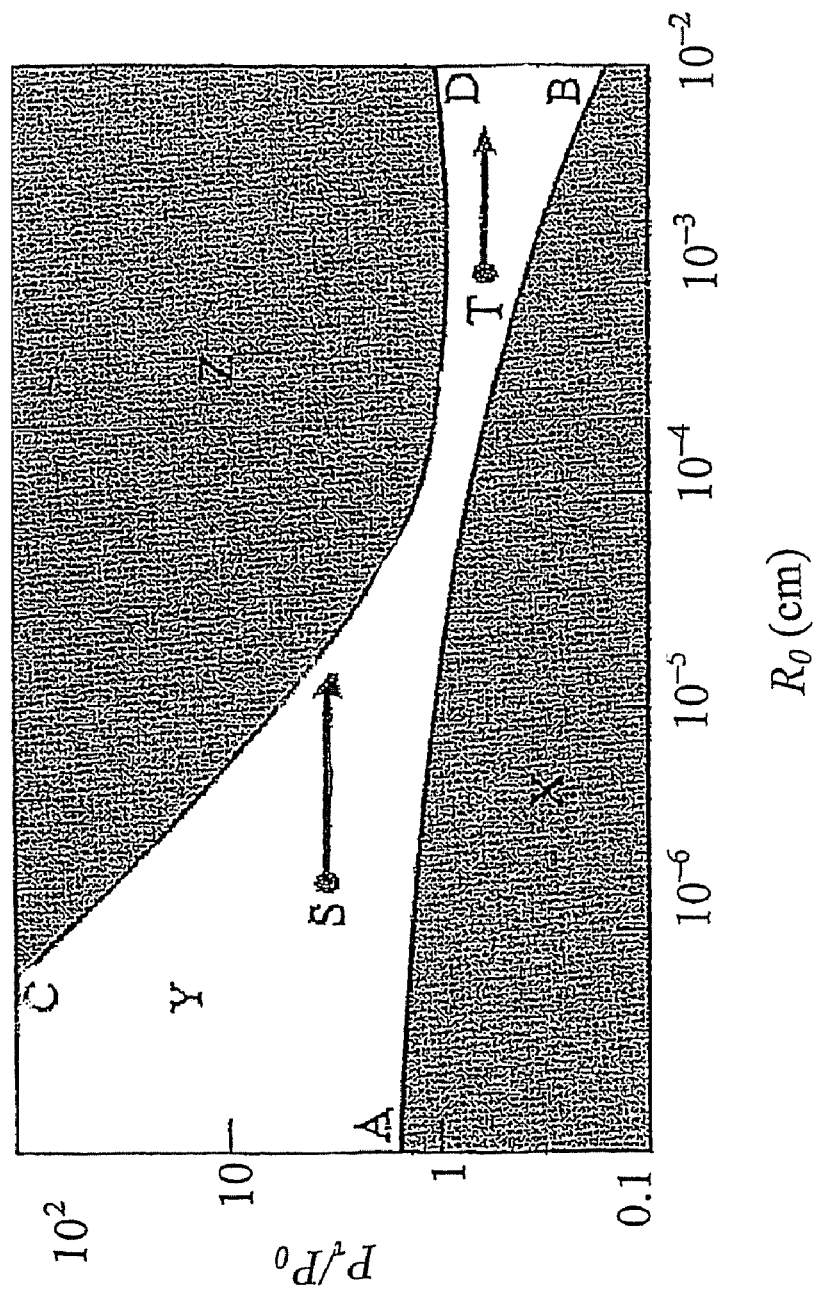
FIG. 3 is a graph that illustrates the behavior of gas bubbles in a liquid as a function of acoustic field characteristics and bubble size.

The present disclosure relates to methods and apparatus for creating and/or controlling transient cavitation in a liquid. Such methods and apparatus can be used for cleaning purposes, e.g., in medical applications where sterilization is required, or in the semiconductor industry for cleaning wafers. Certain embodiments will be described with reference to certain drawings. However, it will be appreciated that these embodiments are given by way of example and not by way of limitation.

Transient cavitation is a form of cavitation where the primary activity occurring in a liquid is bubble collapse. Such bubble collapses can release high amounts of energy towards areas surrounding such collapses. For instance, energy may be released via heat, shockwaves, etc.

Methods and apparatus are disclosed herein for controlling transient cavitation in a liquid that address the problem of non-uniform cleaning performance associated with transient cavitation that was discussed above. In an example method, a specific bubble distribution is generated in a liquid (e.g., a liquid used for cleaning) and the bubbles in the distribution are brought into a specific acoustic field that corresponds with a range of bubble sizes in the distribution so as to control transient cavitation. Such a method may include (i) creating gas bubbles having a range of bubble sizes in a liquid, (ii) creating an acoustic field, and (iii) subjecting the liquid to the acoustic field. In this method, at least one of the range of bubble sizes and the acoustic field are adjusted such that transient cavitation is controlled and, for example, a substantially uniform cleaning is achieved.

Creating bubbles in the liquid can be accomplished in any number of different ways. Generally speaking, creating bubbles in the liquid includes the addition of gas to the liquid. For instance, gases such as nitrogen, oxygen, carbon dioxide, argon, helium, xenon, etc. may be added to the liquid using a gasification unit, e.g., a membrane contactor. Alternatively, (i) the ambient pressure of the liquid; (ii) the hydrostatic pressure of the liquid; (iii) the vapor pressure of the gas; (iv)

the liquid flow; (v) the liquid temperature; and/or (vi) the contact area between gas and liquid are some of the parameters that may be used to control the amount of gas that is dissolved in the liquid. In certain embodiments, most of the gas will be present in a dissolved state. Increasing the pressure of the liquid and/or lowering the temperature allows for the dissolution of more gas in the liquid. It will be appreciated that the amount of gas dissolved and the saturation level for the particular gas (or combination of gasses) being dissolved in a particular liquid will have an influence on bubble formation.

Bubble formation (from the dissolved gas) may be obtained by one (or multiple) compression and decompression cycles. In such an approach, the gasified liquid may be held in a tank that allows for pressurization of the liquid (e.g., increasing the hydrostatic pressure). After pressurization of the gasified liquid, a pressure drop may be realized using a pressure-release valve to release some (or all) of the pressure above an ambient pressure from the tank.

Alternatively, a pressure drop may be achieved using a valve, an orifice or a membrane that couples two tank compartments, where one compartment is at a higher pressure (e.g., the tank containing the liquid) than the other, Opening the valve, orifice or membrane allows for equalization of pressure in the two compartments, which results in a pressure drop in the compartment that initially has the higher pressure and the creation of gas bubbles in the liquid. In such an approach, controlling the pressure differential and/or the speed of the cycles of compression/decompression is one way to control the amount of bubbles and the range of sizes of the gas bubbles.

Yet another way to create bubbles from gas dissolved in a liquid is to raise the temperature of the liquid, e.g., using a heat exchange system. The amount of temperature shift and/or the rate of temperature change is determinative of the size (range of sizes) of the bubbles.

As yet another alternative, acoustic energy may be used to create bubbles in a gasified liquid. In such an approach, bubbles are formed as a result of acoustic energy waves (which are pressure waves) causing compression/decompression cycles in the liquid.

Instead of forming bubbles out of a dissolved gas, direct injection of gas bubbles in a liquid may be used in methods for generating and controlling transient cavitation. In an example of such an approach, a bubbler system, a capillary, a nozzle, etc. is used to inject gas bubbles into a liquid. Alternatively, a membrane contactor with a dedicated pore size may be used, where the membrane separates the liquid from the injected gas.

In general, the design of apparatus used to implement such methods, the amount of gas present in a liquid, the decompression rate, the amount and/or rate of temperature shift, the presence of surface-active agents (e.g. surfactants), etc. affects the final size of the bubbles present in the liquid. The smallest bubbles will disappear again as dissolved gas and the bigger bubbles will grow. The size of a bubble is determinative of whether a bubble grows or disappears (dissolves). This size is dependent on the vapor pressure in the liquid, the ambient pressure of the liquid and the surface tension of the liquid.

Any number of techniques may be used to measure bubble sizes. These techniques include light-scattering and sound dispersion.

In one light-scattering approach, a laser beam is directed through a cell in which a liquid containing gas bubbles is flowing in a continuous way, generally perpendicular to the laser beam. Bubbles in the liquid which cross the path of the laser beam cause light-scattering, which is then detected by a photodiode connected to an oscilloscope. The laser beam itself is blocked by a beam stopper after crossing the cell. The intensity of the light-scattering signal is a measure for the bubble size and is calibrated by means of latex sphere equivalent sizes. This approach may be applied in the presence of an acoustic field.

In one sound-dispersion method, an acoustic transmitter sends an acoustic signal towards a receiver through a fluid medium (liquid) containing gas bubbles. The bubbles present in the fluid influence attenuation and a group velocity of the acoustic signal. These two parameters can then be used to determine a measure of gas bubble size(s) and a number of bubbles. In comparison with the light-scattering method described above, this sound-dispersion method may not be applicable in the presence of an acoustic field due to influences of the acoustic field on the acoustic signal for measuring bubble size(s) and number.

In an example method, the created gas bubbles (or at least a portion of the bubbles) are subjected to an acoustic field with a given acoustic pressure and a given frequency. The applied acoustic field causes particular bubble activity: growth, pulsation and/or collapse of bubbles. All bubbles in the acoustic field are considered active but not all of them may collapse. For instance, as was previously discussed, only bubbles with a particular distribution of bubble size will collapse so as to result in transient cavitation. This phenomenon is described by the Rayleigh-Plesset model, which is known to those working in this area. The following equation describes the adiabatic collapse of a gas bubble in a liquid:

$$\rho\left(R\ddot{R} + \frac{3}{2}\dot{R}^2\right) = P_g(R) - P_0 - P_a(t) + \frac{R}{c}\frac{d}{dt}[P_g(R) - P_a(t)] - 4\eta\frac{\dot{R}}{R} - \frac{2\sigma}{R}$$

wherein R is the bubble radius, $\rho$ is the liquid density, $P_g$ is the vapor pressure, $P_0$ is the ambient hydrostatic pressure, $P_a$ is the time dependent driving pressure, c is the speed of the acoustic waves in the liquid, $\eta$ is the liquid viscosity and $\sigma$ is the liquid surface tension. The driving pressure is dependent on the frequency and intensity (power) of the acoustic field.

Generally, for particle removal applications (such as cleaning of semiconductor substrates), collapsing bubbles cause micro-streaming and shockwaves that result in the creation of a drag force over particles that are present on the surface. If the drag force overcomes the VanderWaals and electrostatic forces between the particle and the surface being cleaned, those particles have a high probability of being removed. Thus, in order to obtain a achieve a more efficient cleaning, it is desirable to increase the amount of micro-streaming and/or shockwaves in a liquid that impinge on the surface being cleaned with the liquid. Such an increase in micro-streaming and/or shockwaves may be achieved by increasing the number of gas bubbles that collapse in the liquid near the surface being cleaned (e.g., a semiconductor substrate).

Figure 4:
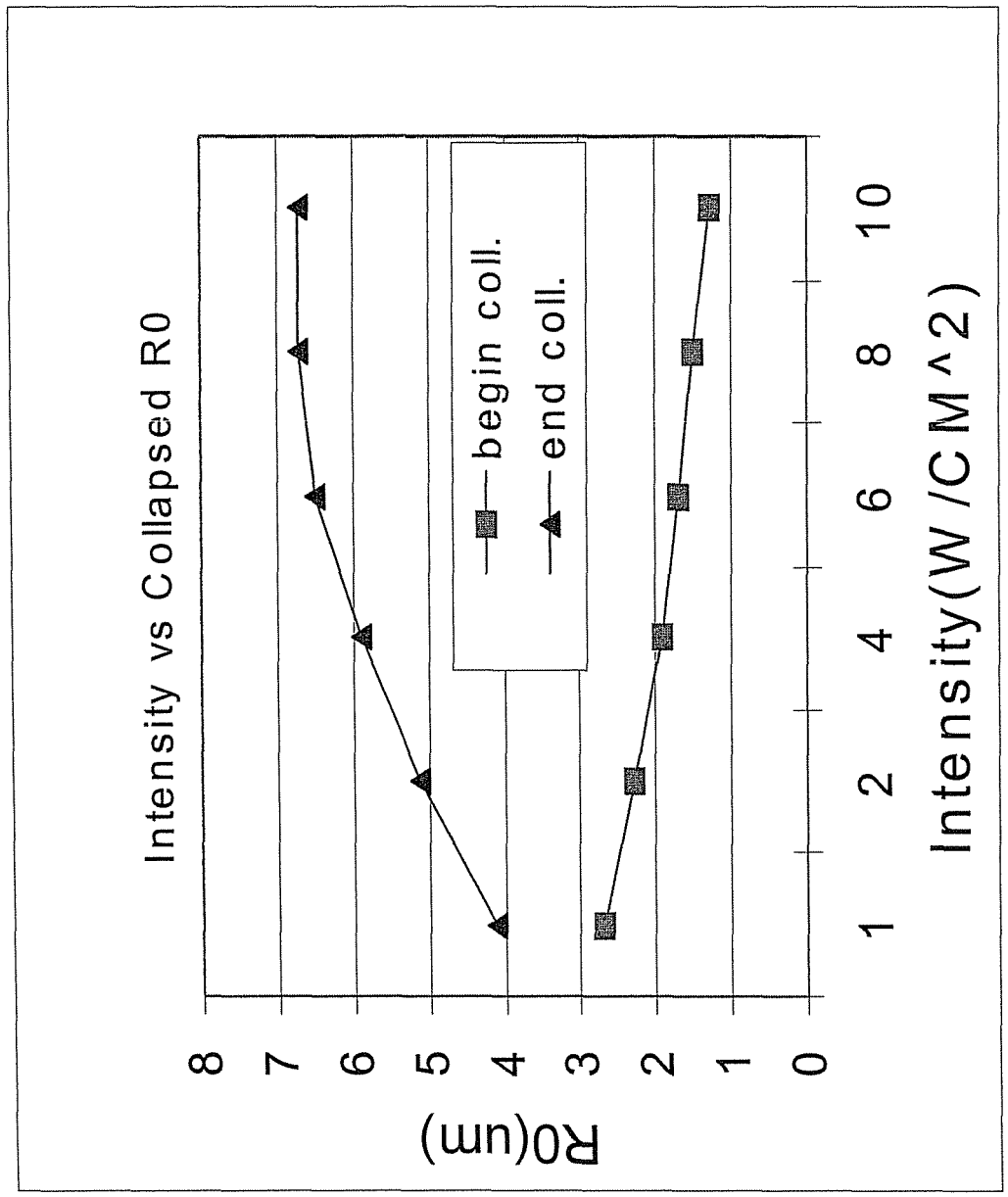
FIG. 4 is a graph that illustrates collapse as a function of bubble size and acoustic field characteristics.

Theoretical calculations and experimental data showed that only a specific range of bubble sizes collapse in a corresponding specific acoustic field. FIG. 4 is a graph which illustrates that bubbles smaller than a first threshold bubble size or bigger than a second threshold bubble size do not tend to collapse in an acoustic field with a particular intensity and a particular frequency, in this case 1 MHz.

Figure 5:
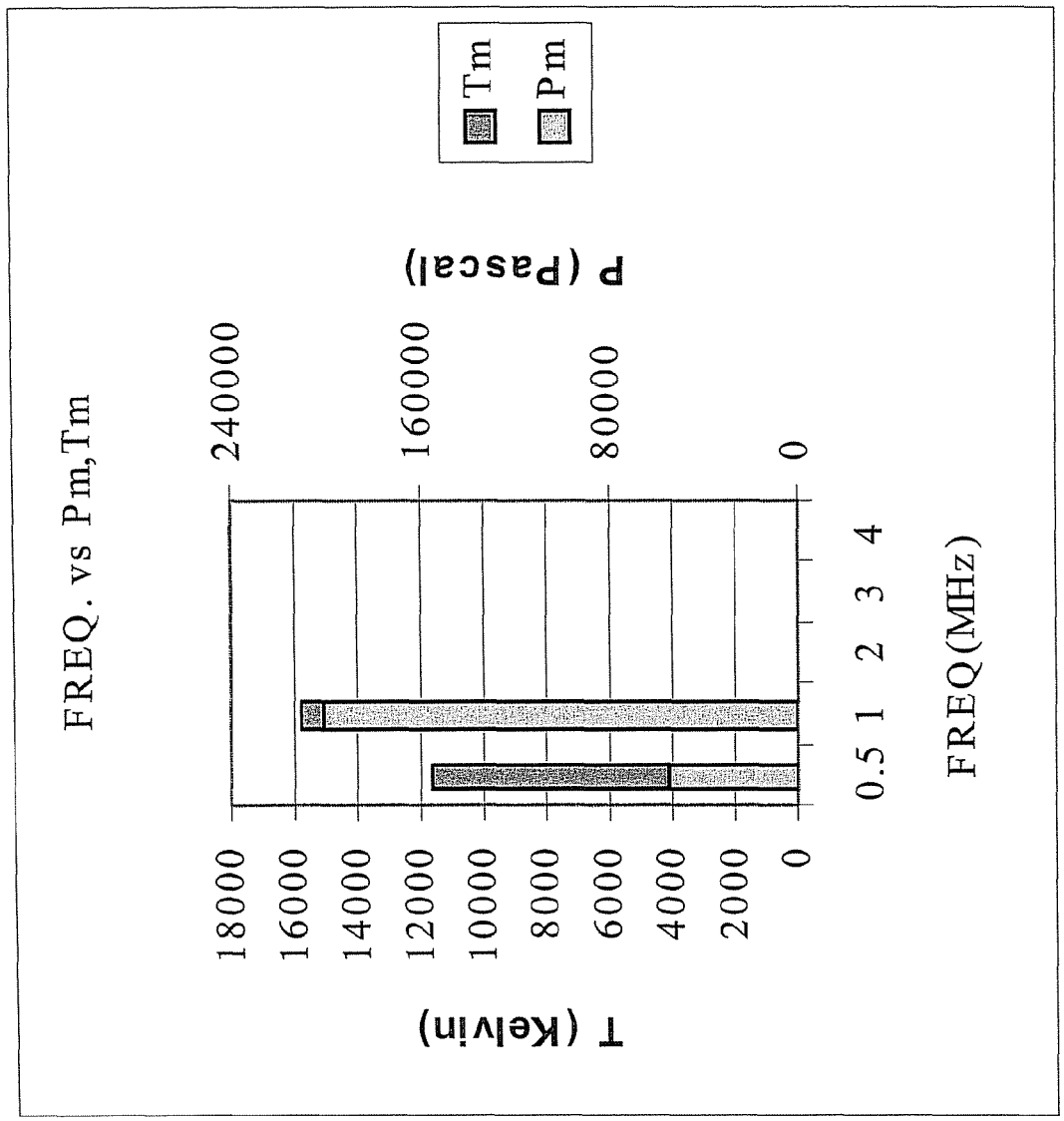
FIG. 5 is a graph that illustrates temperature and pressure during collapse as a function of frequency.

FIG. 5 is a graph that illustrates that an upper-pressure limit (Pm) and an upper-temperature limit (Tm) during bubble collapse is dependent on a frequency of an applied acoustic field. Thus, by generating an appropriate bubble size (or range of sizes) for a particular acoustic field, transient cavitation may be controlled. For cleaning applications, the process conditions may be adjusted in order to obtain substantially uniform cleaning (e.g., particle removal) and reduce the potential for damage to a surface (e.g., a semiconductor substrate) being cleaned by controlling violently collapsing bubbles.

In methods for generating and controlling transient cavitation, a range of gas bubble sizes in the region where an acoustic field is provided and the parameters of the acoustic field are established in correspondence with one another, so as to result in substantially uniform transient cavitation occurring in that region. Accordingly, if the useful range of gas bubble sizes is limited (such as due to the technique used to create bubbles), the parameters of the acoustic field may be adjusted to obtain the desired transient cavitation. Likewise, if there are limitations on varying the parameters of the applied acoustic field, the range and distribution of bubble sizes may be adjusted to achieve the desired transient cavitation.

One way to achieve a desired level of uniformity of transient cavitation in a liquid is by adjusting the range of bubble sizes that are present at the bottom of a tank containing the liquid, when an acoustic field is applied near the surface of the liquid in the tank. This may be achieved in a number of ways. For instance, the range of bubble sizes may be adjusted by adjusting the design or setting of a valve, an orifice, a membrane contactor, etc. used to introduce gas into the liquid. As the bubbles will grow as they rise in the tank, this fact should be considered when adjusting the range of bubble sizes at the bottom of the tank (e.g., when the bubbles are created) so that the bubbles will have the desired range of sizes when entering the acoustic field. In addition the initial size of the generated bubbles, the depth at which the bubbles are generated, the depth of the tank and the position of the acoustic field may be varied. The liquid flow speed and orientation is another parameter that can be varied and has an influence on the size and distribution of the gas bubbles in the liquid.

Compression and decompression cycles may also be used for adjusting the range of bubble sizes, as well as for generating bubbles in a gasified liquid. Increasing pressure results in a corresponding decrease in bubble size, while decreasing pressure results in a corresponding increase in bubble size. Furthermore, gradual decompression (e.g., releasing pressure in the tank in several steps) may be used to generate bubbles at different depths in the tank in order to achieve a desired bubble distribution.

Another approach for adjusting the range of bubble sizes is to vary the range of generated bubble sizes over time. In such an approach, the period of time during which smaller bubbles are generated will result in bubbles of the desired range of sizes being present at a shallower depth in the liquid. Comparatively, the period of time during which larger bubbles are generated will result in bubbles of the desired range of sizes being present at deeper depths in the liquid. Because the bubbles grow as they rise, a uniform bubble distribution through a larger range of depths is obtained in this way.

Alternatively or in combination with other approaches, the gas that is introduced (e.g., dissolved) in the liquid may be varied as a factor in controlling the range of sizes of bubbles. Different gases with different material properties allow for influencing the final bubble size distribution as well. For example, $N_2$ gas has a lower saturation level in pure water than $O_2$ gas. Thus, the use of $N_2$ will more readily result in gas bubbles being formed when compared to $O_2$. Therefore, $N_2$ gas may be introduced into the liquids at a shallower depth than $O_2$ and produce a region in the liquid where, as the bubbles rise in the tank, the bubble size is approximately the same for both bubbles of both $N_2$ and $O_2$ gasses. Of course, more than two types of gasses can be used for further controlling the range of bubble sizes and/or the distribution of bubbles in a liquid.

Yet another technique that may be used for adjusting the range of sizes of bubbles and the distribution of bubbles is the use of surfactants for lowering the surface tension of the liquid in which the bubbles are being produced. Such a reduction in surface tension will result in a corresponding increase in bubble size.

Generation of an acoustic field as part of a method for controlling transient cavitation may likewise be accomplished using any number of possible approaches. For example, an acoustic field may be generated using multiple transducers that generate acoustic signals with different frequencies. The acoustic field produced in a liquid contained in a tank using such an approach may be termed a multiple frequency field. Using such an approach, a broader range of bubble sizes can be controlled with respect to cavitation. For example, a megasonic field of 1 MHz affects bigger bubbles than a field of 2 MHz. Therefore, if a megasonic field of 1 MHz is applied at a shallower depth than a 2 MHz field, a broader range of bubble sizes will be affected through the depth of the tank, resulting in more uniform transient cavitation at a desired depth in the tank.

Furthermore, yet an additional acoustic field (having one or more frequencies) may be applied at depth below a depth where a desired range of bubble sizes is to be achieved. In such an approach, the additional acoustic field (with appropriate parameters) is used to cause a range (or ranges) of bubble sizes that are undesirable to collapse before entering the region where the final range of bubble sizes is desired.

Figure 6:
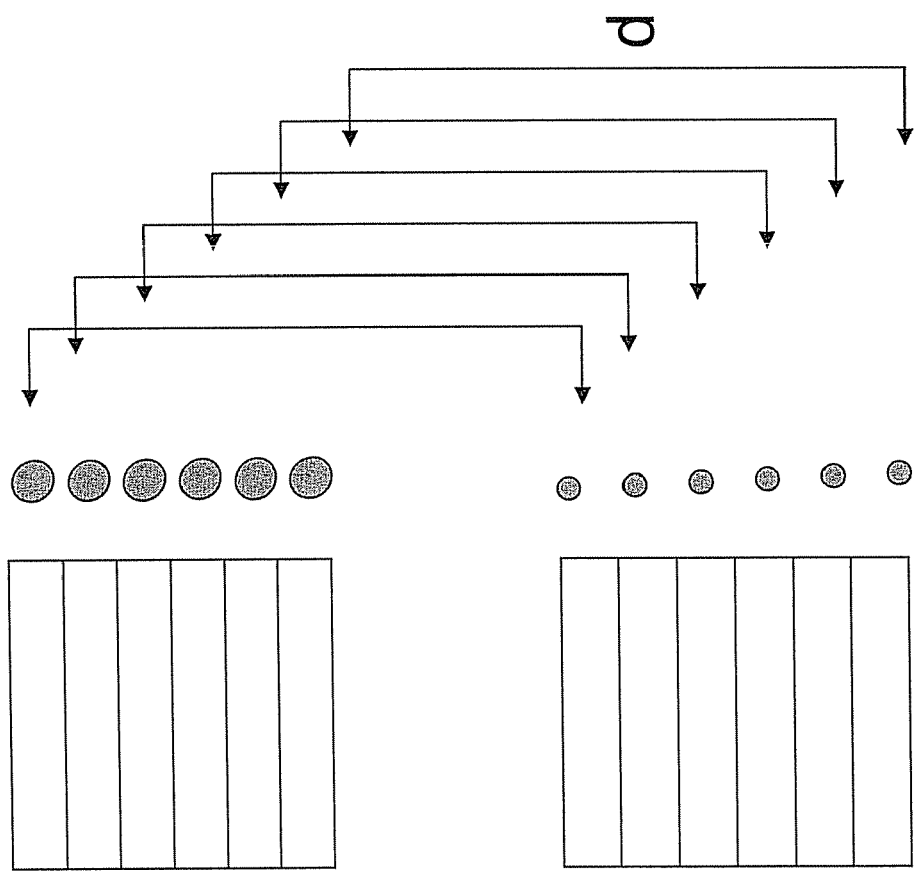
FIG. 6 is a diagram that illustrates an arrangement of two pluralities of transducers that may used to implement methods as described herein.

FIG. 6 is a schematic illustration of an apparatus that may be used to implement at least some of the approaches described herein. For the apparatus illustrated in FIG. 6, a first acoustic field is generated at the bottom of a liquid tank. The first acoustic field is generated by a first plurality of transducers operating at a common first frequency to create bubbles with a particular range of sizes. At a shallower depth in the tank, a second plurality of transducers operating at a second common frequency is positioned such that it causes grown bubbles to collapse. For a fixed liquid flow and a fixed distance (d) between a given single transducer of the first plurality of transducers at the bottom of the tank and a corresponding given single transducer of the second plurality of transducers at shallower depth, substantially every bubble generated at the given single transducer of the first plurality of transducers will grow by substantially the same amount and will collapse when subjected to the acoustic field of the corresponding given single transducer of the second plurality of transducers.

Figure 7:
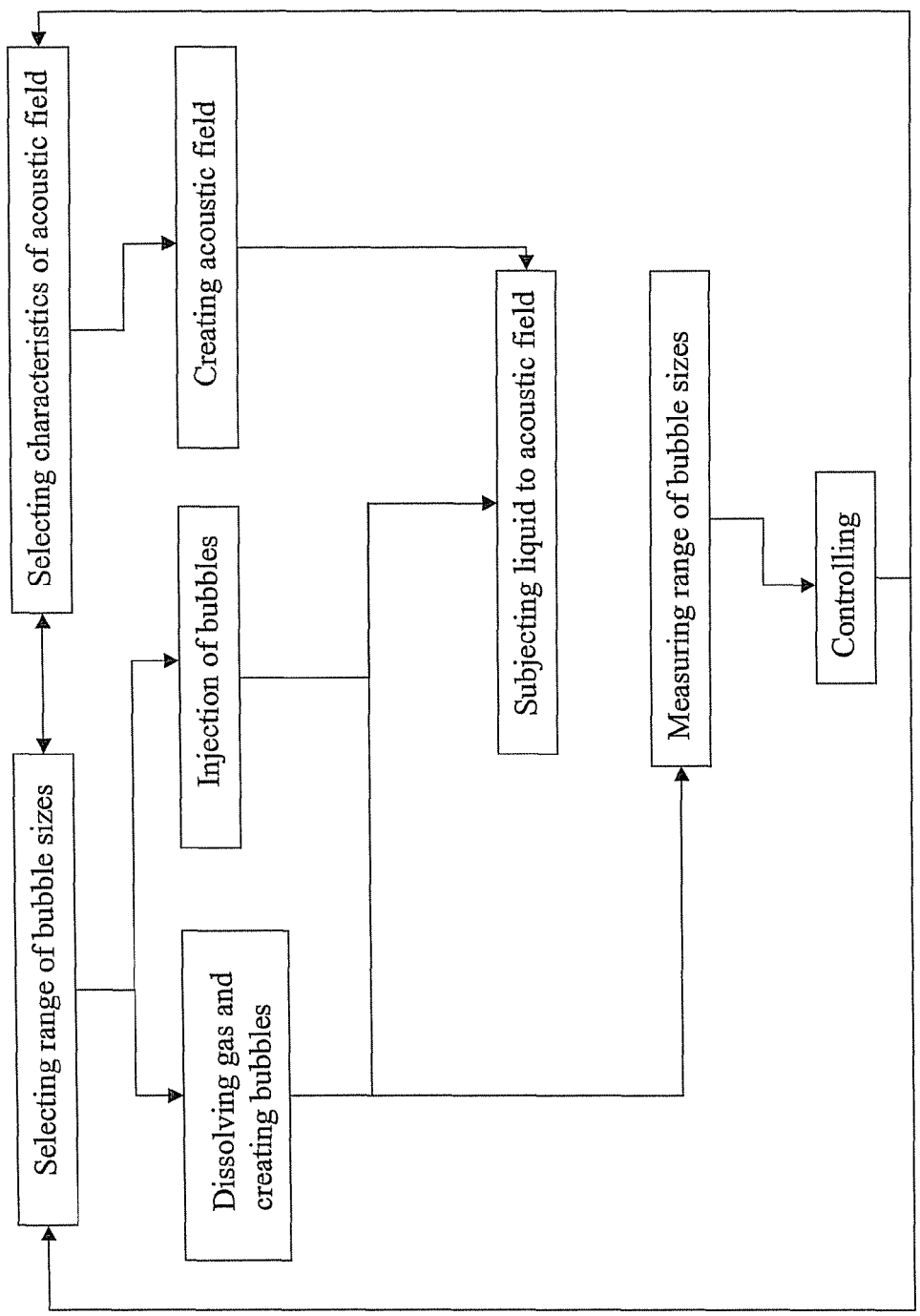
FIG. 7 is flowchart illustrating a process flow of a particular method for generating and controlling transient cavitation.

FIG. 7 is a flowchart that illustrates an example process flow for generating and controlling transient cavitation. In the process of FIG. 7, characteristics of an acoustic field are selected, followed by selection of a range of bubble sizes based on the Rayleigh-Plesset model. As was discussed above, these operations may also be done in reverse order.

In the method of FIG. 7, the selected range of bubble sizes is created by dissolving gas in the liquid and creating bubbles or, alternatively, by direct injection of gas bubbles in the liquid. When the selected acoustic field is generated, the liquid with bubbles in the selected range of bubble sizes is subjected to it. After creating or injecting gas bubbles, the range of bubble sizes is measured by one of the measurement techniques described above. The results of the measurement are used to control the range and creation/injection of bubbles and/or the characteristics and creation of the acoustic field. In this way a feed-back loop process is created for controlling transient cavitation in the liquid.

Figure 8:
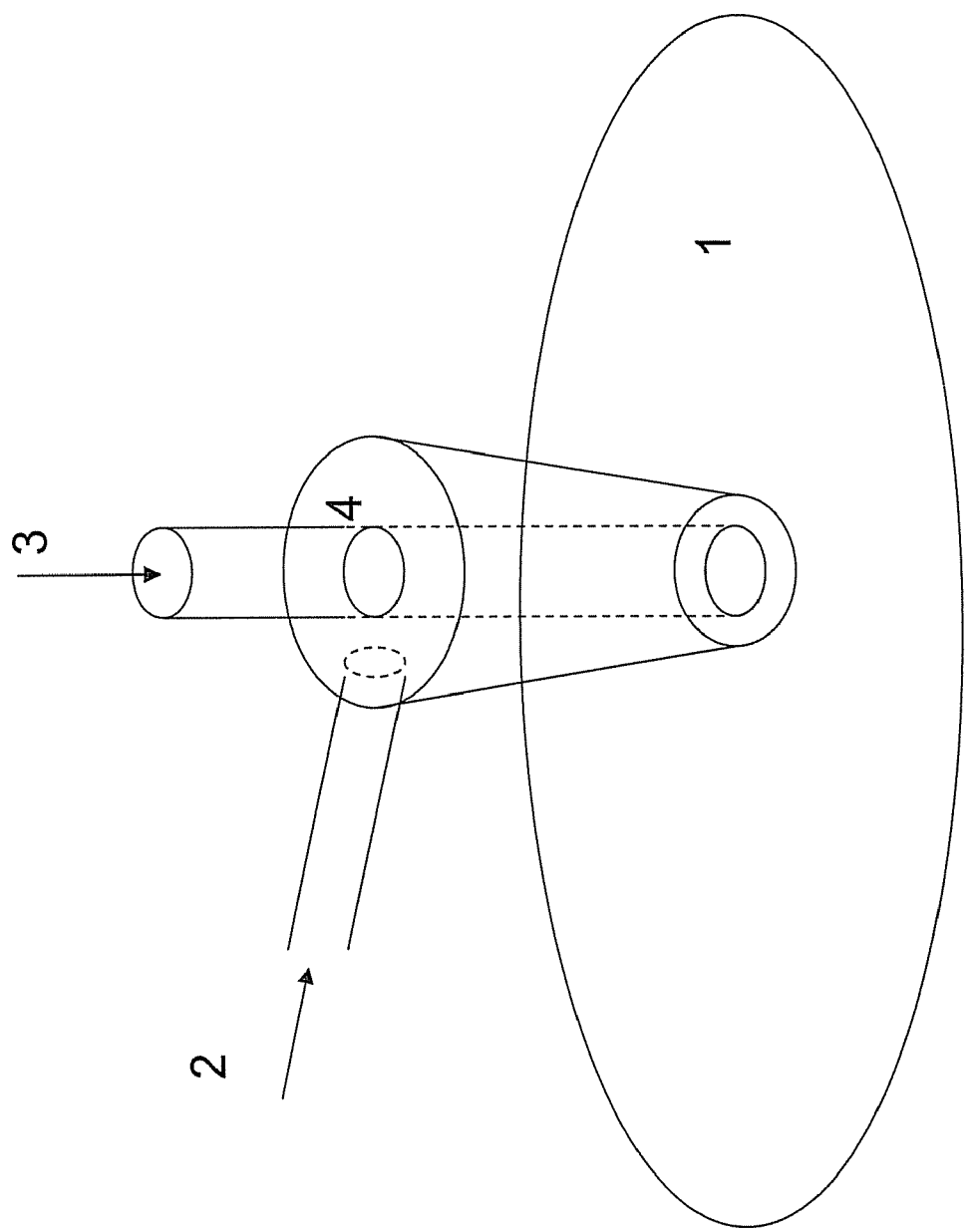
FIG. 8 is a schematic drawing of a spray nozzle that may be used to implement methods as described herein.

The methods and apparatus described herein may also be used in applications where the acoustic field is not generated in a tank containing a liquid. For example, in semiconductor applications, several batch and single wafer cleaning tools are known where a cleaning solution is applied on a rotating wafer and an acoustic field is communicated to the cleaning solution via the wafer. Also single wafer cleaning tools are known where the cleaning solution is subjected to an acoustic field as the fluid is being supplied (e.g., as it impinges on the surface of a wafer) by means of a megasonic or ultrasonic spray nozzle. Such a spray nozzle can be constructed in the fashion shown in FIG. 8. For the nozzle of FIG. 8, a deionized water (DIW) supply 2 and a gas+DIW supply 3 are communicated through the nozzle. A transducer 4 is mounted in the tip of the nozzle, surrounding the gas+DIW supply 3. In this set-up, a mixture of DIW and gas, containing gas bubbles with a selected range of bubble sizes, is generated before entering the DIW+gas supply 3.

Two other possible fields of application for the approaches described herein are sonochemistry and ultrasound diagnostics, though other applications exist. For sonochemistry, such methods may be used to inject energy from transient cavitation in a controlled way in order to obtain a uniform catalytic effect resulting in a uniform chemical reaction speed. For ultrasound diagnostics, bubble sizes and acoustic field(s) can be modified to enhance scattering of ultrasound by the bubbles so as to result in better image contrast.

EXAMPLES

Example 1

By means of the Young formula, which is based on the Rayleigh-Plesset model, the resonant radius of a bubble at a particular frequency can be calculated:

$$\omega_r^2 = \left(\frac{3\gamma P_0}{\rho R_0^2}\right)$$

If the frequency ($\phi_r$)=1.8 MHz and $\omega_r$=2π$\phi_r$, the adiabatic constant (γ) for oxygen=1.4, the density (ρ) for DIW=1000 kg/m$^3$ and the hydrostatic pressure (P$_0$) at 0.25 m depth=103800 Pascal, then the resonant radius is 1.85 μm. This means that in a 1.8 MHz acoustic field, even at very low acoustic pressure (e.g. 0.1 W/cm$^2$), bubbles with a radius of 1.85 μm will collapse. At higher acoustic pressures (e.g. 10 W/cm$^2$), a broader range of bubbles sizes close to the resonant radius will collapse as well.

Figure 9:
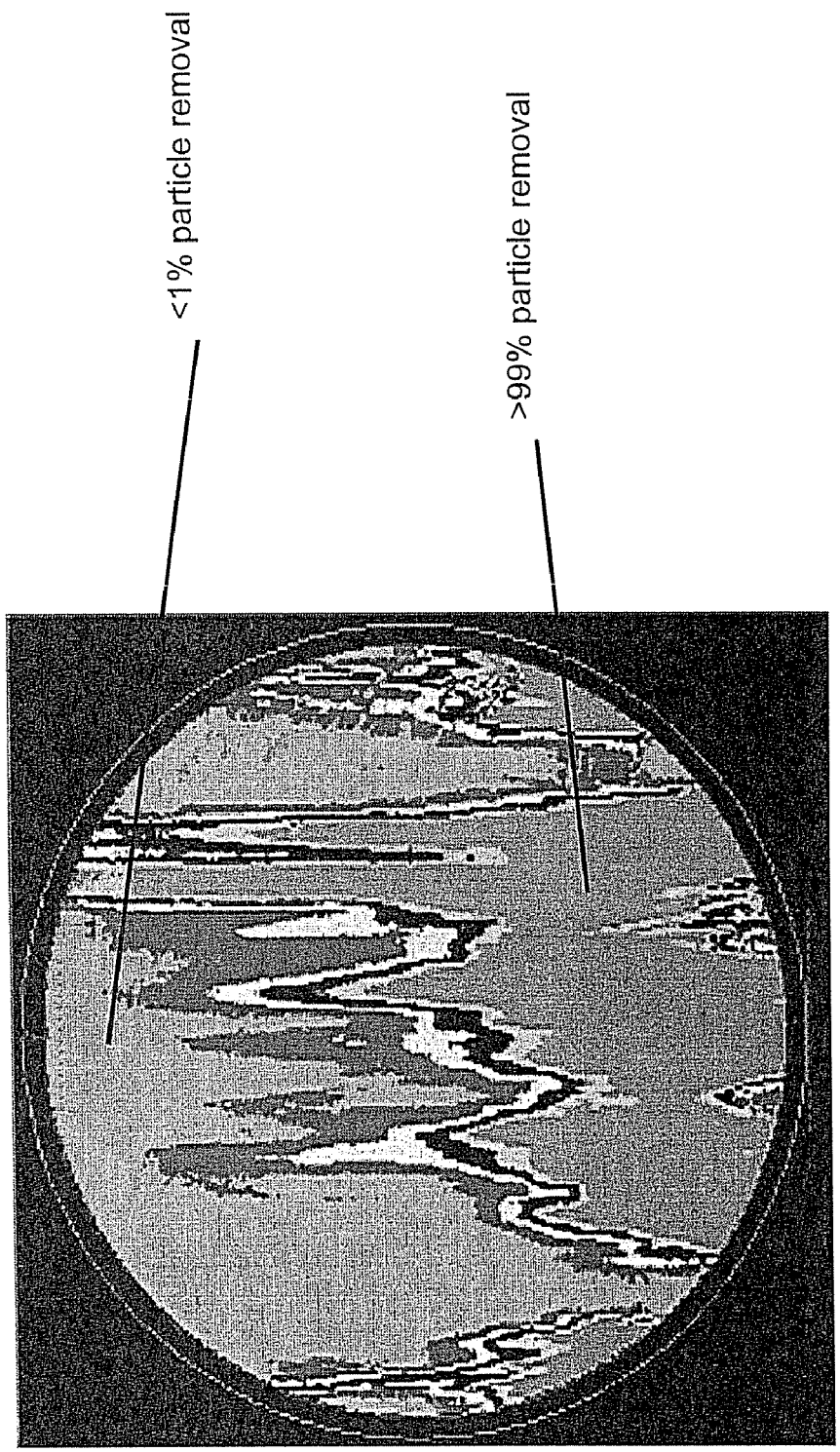
FIG. 9 is a diagram illustrating the PRE for a cleaning process conducted at 1.8 MHz, 5 W/cm$^2$, 2.5 bar overpressure and 18 ppm oxygen.

In a particular Techsonic wafer cleaning tank, an acoustic field of 1.8 MHz and 5 W/cm$^2$ was generated. The water and gas supply system of the tank, working at 2.5 bar overpressure and containing 18 ppm oxygen after passing a Mykrolis Phasor 2 gasification unit, operated at a flow of 8 SLM with the tank filled a depth 0.25 m from the bottom. A decompression step (to 103800 Pascal) was performed at the inlet of the tank. This decompression step resulted in a bubble size distribution close to the resonant radius at the bottom of the tank. The results of Particle Removal Efficiency (PRE) for 80 nm SiO$_2$ particles on a silicon wafer, measured by the haze channel of the SP1DLS from KLA-Tencor is shown in FIG. 9. At the lower part of the wafer, PRE is about 99%, where at the top part, PRE is only 1%.

Figure 10:
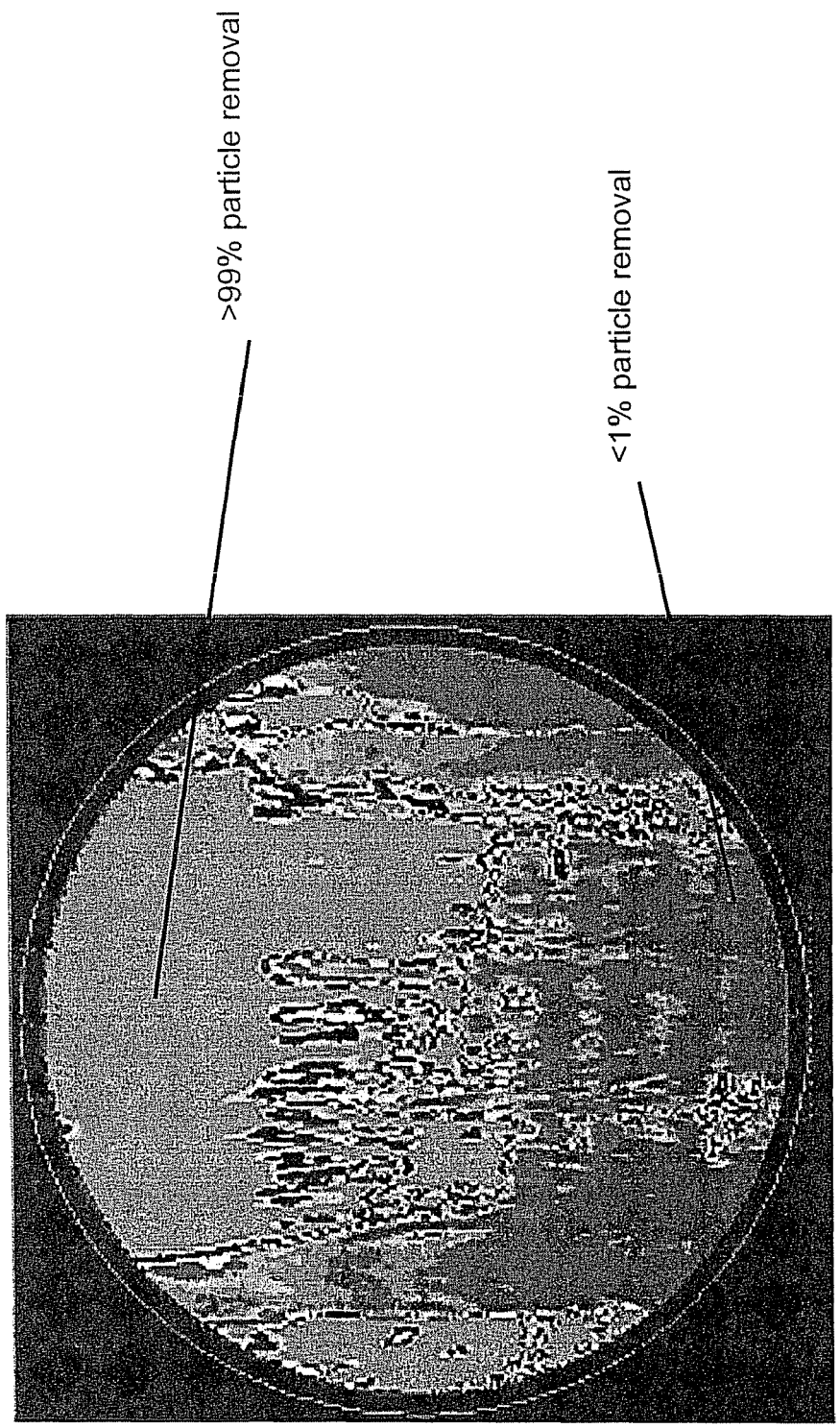
FIG. 10 is a diagram illustrating the PRE for a cleaning process conducted at 1.8 MHz, 5 W/cm$^2$, 2.5 bar overpressure and 10 ppm oxygen.

When supplying water at the bottom of the tank containing only 10 ppm of oxygen, bubbles with a size below the resonant radius are generated. As they rise in the tank, those bubbles grow in size due to changes in hydrostatic pressure and rectified diffusion until they reach a bubble size distribution close to the resonant radius. In this case, the results of PRE are given in FIG. 10. At the lower part of the wafer PRE is only 1% where at the top part, PRE is about 99%.

Example 2

Figure 11:
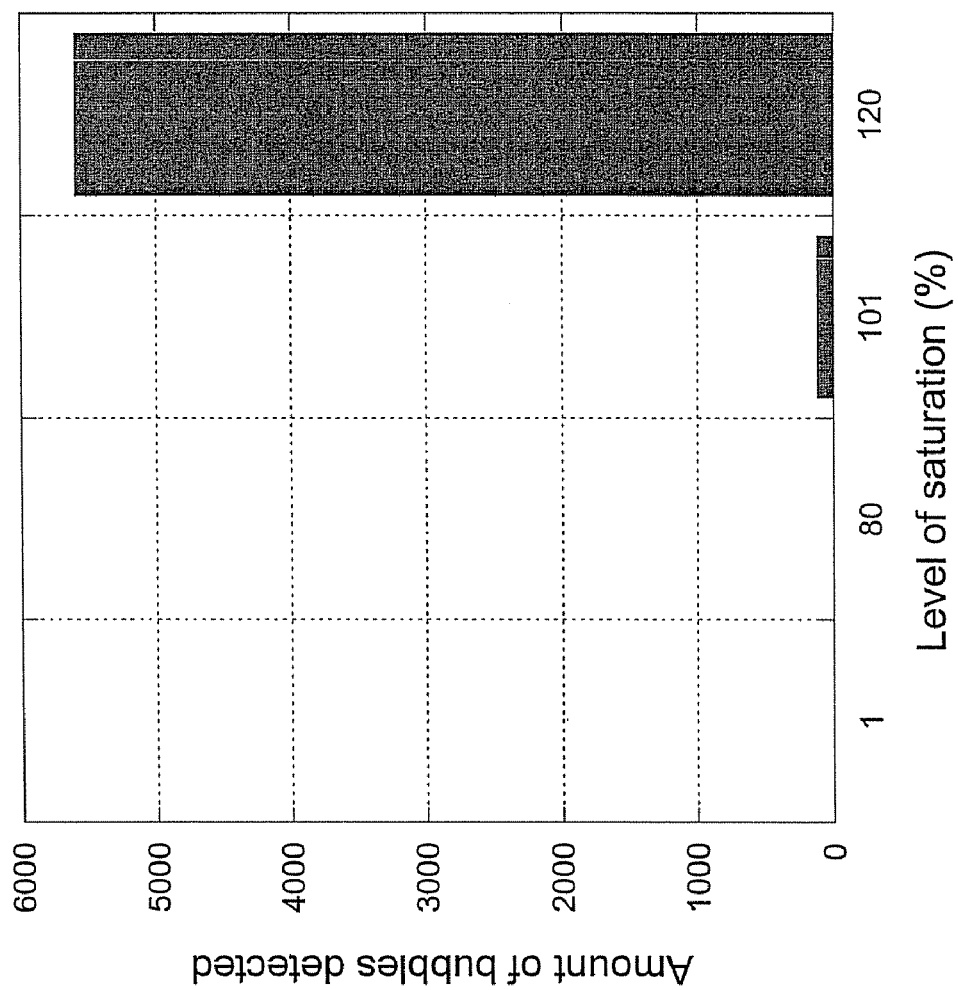
FIG. 11 is a graph illustrating an amount of bubbles versus saturation level.

A set of silicon substrates contaminated with 34 nm SiO$_2$-particles was used to evaluate the cleaning performance of a single wafer megasonic cleaning tool. The formation of bubbles to achieve (generate) transient cavitation, was done using a chemical supply system prior to applying a megasonic field. A backpressure regulator was used to realize a pressure drop, which created a controlled over-saturation of a specific gas, in this case argon. This process resulted in a specific bubble distribution. To obtain this bubble distribution, ultra pure water was gasified at high pressure (P$_{water}$=2.6 bar). The amount of argon added was chosen such that the liquid was under-saturated at the 2.6 bar level (no bubbles were present), but 20% over-saturated after the pressure drop (P$_{water}$~1 bar). Due to the over-saturation, the excess amount of argon created a typical bubble distribution in the supply system, which is shown in FIG. 11. The generated bubble distribution was monitored by an in-line light scattering tool, the tool being designed to measure bubbles larger than 2 μm.

The ultra pure water containing the argon bubbles was the subjected to the megasonic field. The activity of the bubbles in the area of application of the megasonic field resulted (after 1 minute of subjection to the megasonic field at 125 W input power) in a PRE on the order of 80% for 34 nm SiO$_2$-particles as compared to 0% when no gases were added and 40% when the level of saturation was below 100%.

Conclusion

While a number of aspects and embodiments have been discussed above, it will be appreciated that various modifications, permutations, additions and/or sub-combinations of these aspects and embodiments are possible. It is therefore intended that the following appended claims and claims hereafter introduced are interpreted to include all such modifications, permutations, additions and/or sub-combinations as are within their true spirit and scope.

We claim:

1. A method for cleaning a surface comprising:
selecting a range of bubble sizes to be created in a liquid;
selecting characteristics of an acoustic field to be applied to the liquid;
providing a surface to be cleaned in contact with the liquid;
creating gas bubbles of the selected range of bubble sizes in the liquid near the surface to be cleaned, the creating gas bubbles comprising dissolving gas in the liquid using a gasification unit,
   injecting gas into the liquid using one of a bubbler system, a capillary, a nozzle, and a membrane contactor, or
   subjecting the liquid to a pressure drop, one or more compression/decompression cycles, an increase in temperature or one or more heating/cooling cycles;
creating a fixed acoustic field with the selected characteristics; and
subjecting the liquid with created bubbles to the fixed acoustic field to obtain cavitating liquid, and
subjecting the surface to be cleaned to the cavitating liquid, wherein the range of bubble sizes is selected subsequent to and in dependence on the selection of the characteristics of the acoustic field so as to generate and control transient cavitation in the liquid near the surface to be cleaned upon subjecting the liquid with the bubbles to the fixed acoustic field.

2. The method of claim 1, wherein creating gas bubbles of the selected range of bubble sizes comprises dissolving gas in the liquid using a gasification unit.

3. The method of claim 1, wherein creating gas bubbles of the selected range of bubble sizes comprises injecting gas into the liquid using one of a bubbler system, a capillary, a nozzle, and a membrane contactor.

4. The method of claim 1, wherein creating gas bubbles of the selected range of bubble sizes comprises one of (i) subjecting the liquid to a pressure drop and (ii) subjecting the liquid to one or more compression/decompression cycles.

5. The method of claim 1, wherein creating gas bubbles of the selected range of bubble sizes comprises one of (i) subjecting the liquid to an increase in temperature and (ii) subjecting the liquid to one or more heating/cooling cycles.

6. The method of claim 1, wherein creating gas bubbles of the selected range of bubble sizes comprises introducing two or more different gases into the liquid.

7. The method of claim 1, wherein creating gas bubbles of the selected range of bubble sizes comprises adding a surfactant to the liquid.

8. The method of claim 1, wherein the selected range of bubble sizes is varied over time.

9. The method of claim 1, wherein the fixed acoustic field comprises one or more frequencies.

10. The method of claim 1, wherein the surface to be cleaned is a semiconductor substrate.

11. The method according to claim 1, wherein the range of bubble sizes in the region subjected to the fixed acoustic field and the characteristics of the fixed acoustic field are selected so as to result in substantially uniform transient cavitation in the region.

12. The method according to claim 1, wherein at least two different gasses are used to control the size of the bubbles.

13. The method according to claim 1, wherein the range of bubble sizes is created by adjusting the range of bubble sizes that are present at the bottom of a tank containing the liquid, and wherein the fixed acoustic field is applied near the surface of the liquid in the tank.

* * * * *